United States Patent
Rodriguez

(10) Patent No.: US 10,700,486 B2
(45) Date of Patent: *Jun. 30, 2020

(54) FORMING A CABLE CONNECTION SYSTEM

(71) Applicant: International Business Machines Corporation, Armonk, NY (US)

(72) Inventor: Jean-Michel Rodriguez, Mauguio (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/364,761

(22) Filed: Mar. 26, 2019

(65) Prior Publication Data
US 2019/0221984 A1 Jul. 18, 2019

Related U.S. Application Data

(62) Division of application No. 15/168,366, filed on May 31, 2016, now Pat. No. 10,312,654.

(51) Int. Cl.
*H01R 33/94* (2006.01)
*H01R 43/26* (2006.01)
(Continued)

(52) U.S. Cl.
CPC ........... *H01R 43/26* (2013.01); *H01R 13/518* (2013.01); *H01R 13/627* (2013.01);
(Continued)

(58) Field of Classification Search
CPC ........ H01R 24/54; H01R 31/06; H01R 33/88; H01R 33/94; H01R 13/659; H01R 13/518;
(Continued)

(56) References Cited

U.S. PATENT DOCUMENTS

| | | | | |
|---|---|---|---|---|
| 1,872,298 | A | * | 8/1932 | Kehoe ................ H01H 1/64 200/304 |
| 6,011,221 | A | | 1/2000 | Lecinski et al. |

(Continued)

OTHER PUBLICATIONS ip.com, Method and Apparatus for Flexible Cable Management in DataCenter, IP.com No. IPCOM000241422D, IP.com Electronic Publication Date: Apr. 25, 2015, 28 pages.

(Continued)

*Primary Examiner* — Felix O Figueroa
(74) *Attorney, Agent, or Firm* — Schmeiser, Olsen & Watts, LLP; Mark Vallone

(57) ABSTRACT

A method of forming a cable connection system. A base and a rack are provided, and the base is coupled with the rack, using a coupling mechanism, during a connect mode of operation. The rack includes a first rack surface and a second rack surface perpendicular to the first rack surface, wherein the first rack surface is perpendicular to a raised floor surface, wherein the second rack surface is on, and parallel to, the raised floor surface. The base is coupled to cables connected to the rack, wherein the base includes a first base surface, a second base surface perpendicular to the first base surface, and an array of slots into which corresponding network servers are screwed into place. The coupling mechanism includes a group of base connectors on the first surface of the base and a group of rack connectors on the first surface of the rack.

14 Claims, 4 Drawing Sheets

(51) Int. Cl.
   *H01R 33/88*    (2006.01)
   *H01R 13/518*   (2006.01)
   *H05K 7/14*     (2006.01)
   *H01R 13/659*   (2011.01)
   *H05K 7/18*     (2006.01)
   *H01R 13/627*   (2006.01)
   *H01R 35/02*    (2006.01)

(52) U.S. Cl.
   CPC ............ *H01R 13/659* (2013.01); *H01R 33/88* (2013.01); *H01R 33/94* (2013.01); *H01R 35/02* (2013.01); *H05K 7/1491* (2013.01); *H05K 7/1492* (2013.01); *H05K 7/186* (2013.01)

(58) Field of Classification Search
   CPC ...... H05K 7/1491; H05K 7/1492; H05K 7/18; H05K 7/186; H05K 7/1489; H05K 7/1487
   See application file for complete search history.

(56) References Cited

U.S. PATENT DOCUMENTS

| | | | |
   |---|---|---|---|
   | 6,048,228 | A | 4/2000 | Aso |
   | 6,059,595 | A | 5/2000 | Lacrouts-Cazenave |
   | 6,146,210 | A | 11/2000 | Cha et al. |
   | 6,245,998 | B1 | 6/2001 | Curry et al. |
   | 7,261,579 | B2 | 8/2007 | Ku et al. |
   | 8,472,198 | B2 | 6/2013 | Peng et al. |
   | 8,589,609 | B2 | 11/2013 | Hilburn |
   | 8,598,453 | B2 | 12/2013 | Hsiao |
   | 9,048,569 | B2 | 6/2015 | Chen |
   | 9,722,381 | B1 * | 8/2017 | Moen ............... H01R 33/88 |
   | 2006/0294280 | A1 | 12/2006 | Chen et al. |
   | 2014/0022755 | A1 * | 1/2014 | Saito ............... H02G 3/0456 361/829 |
   | 2017/0346246 | A1 | 11/2017 | Rodriguez |
   | 2017/0347482 | A1 | 11/2017 | Rodriguez |
   | 2019/0221983 | A1 | 7/2019 | Rodriguez |
   | 2019/0307015 | A1 | 10/2019 | Rodriguez |

OTHER PUBLICATIONS

U.S. Appl. No. 15/255,268, filed Sep. 2, 2016.
Restriction (dated Mar. 22, 2018) for U.S. Appl. No. 15/168,366, filed May 31, 2016.
Restriction Response (dated May 21, 2018) for U.S. Appl. No. 15/168,366, filed May 31, 2016.
Office Action (dated Aug. 14, 2018) for U.S. Appl. No. 15/168,366, filed May 31, 2016.
Amendment (dated Nov. 14, 2018) for U.S. Appl. No. 15/168,366, filed May 31, 2016.
Notice of Allowance (dated Jan. 24, 2019) for U.S. Appl. No. 15/168,366, filed May 31, 2016.
Restriction (dated Apr. 16, 2018) for U.S. Appl. No. 15/255,268, filed Sep. 2, 2016.
Restriction Response (dated Jun. 13, 2018) for U.S. Appl. No. 15/255,268, filed Sep. 2, 2016.
Office Action (dated Apr. 16, 2018) for U.S. Appl. No. 15/255,268, filed Sep. 2, 2016.
Amendment (dated Nov. 30, 2018) for U.S. Appl. No. 15/255,268, filed Sep. 2, 2016.
Final Office Action (dated Jan. 30, 2019) for U.S. Appl. No. 15/255,268, filed Sep. 2, 2016.
U.S. Appl. No. 16/364,586, filed Mar. 26, 2019.
Notice of Allowance (dated Apr. 15, 2019) for U.S. Appl. No. 15/255,268, filed Sep. 2, 2016.
Office Action (dated Jul. 22, 2019) for U.S. Appl. No. 16/364,586, filed Mar. 26, 2019.
Amendment (dated Oct. 21, 2019) for U.S. Appl. No. 16/364,586, filed Mar. 26, 2019.

* cited by examiner

FORMING A CABLE CONNECTION SYSTEM

This application is a divisional application claiming priority to Ser. No. 15/168,366, filed May 31, 2016, now U.S. Pat. No. 10,312,654, issued Jun. 4, 2019.

TECHNICAL FIELD

The present invention relates to a cable connection system and to a method for forming the cable connection system.

BACKGROUND

In the context of information technology (IT), it may be desirable to provide network resources, such as, for example, multiple network servers in a given data center. Furthermore, it may be desirable to provide such network resources in a consolidated form and with regard to efficient and optimum usage of the available floor space in such a data center. In this regard, the network servers may be provided in a stack within a framework provided by an IT rack.

In typical data centers, multiple racks may be found. Each rack may comprise multiple network servers stacked relative to each other. Each rack is designed to comprise multiple slots, also referred to as bays. Each bay provides an allocated space for mounting at least a given network server. Fastening screws are provided for each bay for facilitating secured accommodation of a given network server within each bay.

Because multiple network servers may typically be mounted within a given rack, ventilation of the heat produced by any of the network servers operating within that given rack are to be considered. It may also be desirable to additionally provide mechanisms for cooling a given rack when the network servers mounted in the given rack are in use.

To connect a given rack, electrically or otherwise, either with respect to another given rack or to change such connections between the network servers housed in the given rack, both such scenarios hereinafter referred to generally as a rack connection, cables and relatively complex cabling connections may be required. Thus, and particularly, in the event that the cabling format and/or configuration are to be changed for a given rack, performing the change(s) may be complicated and time-consuming and may, for example, even take days. Furthermore, mistakes in performing such connections may be inevitable due to the multiplicity of racks, cabling and/or network servers.

Accordingly, it is a challenge to perform rack connection with relative ease, time-efficiency and/or with reduced mistakes in cable connection.

SUMMARY

Embodiments of the present invention provide a cable connection system. The cable connection system includes a base and a coupling mechanism. The base is configured to be coupled to a given cable. The given cable is configured to be connected to a given rack. The coupling mechanism is configured to couple the base with the given rack during a given connect mode of operation. The coupling mechanism includes a group of base connectors provided on a first surface of the base. The first surface is arranged to lie substantially flush with the given rack.

Embodiments of the present invention provide a method of forming the cable connection system. The method includes: providing the base and coupling the coupling mechanism to the base.

BRIEF DESCRIPTION OF THE DRAWINGS

Reference will now be made, by way of example, to the accompanying drawings.

DETAILED DESCRIPTION

Figure 1:
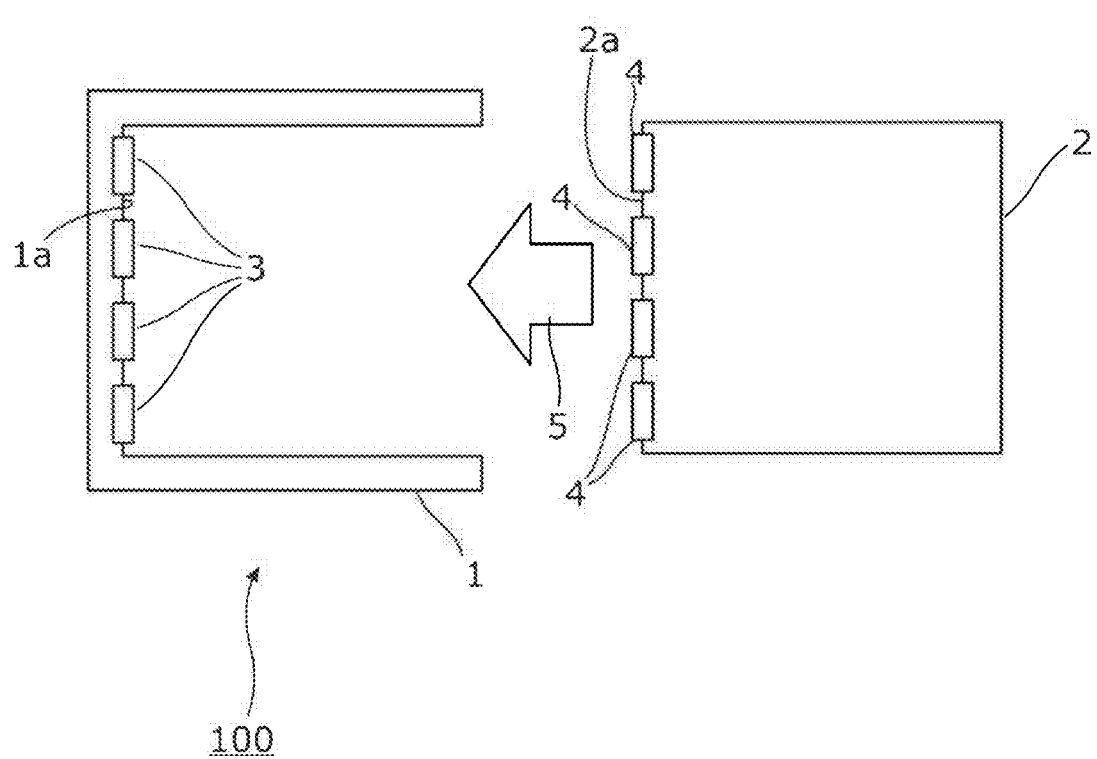
FIG. 1 illustrates a top view of a cable connection system in accordance with embodiments of the present invention.

Within the description, the same reference numerals or signs are used to denote the same parts or the like.

FIG. 1 illustrates a top view of a cable connection system 100, in accordance with embodiments of the present invention. The cable connection system 100 may be used to facilitate cable connection with at least a given rack 2. The given rack 2 may comprise multiple electronic equipment units, such as, for example, respective computing units that may each be dedicated for use as a network server. Because the given rack 2 facilitates a framework to provide network servers in a stacked configuration, network resources may be pooled and stored with relative efficiency in a given space. This makes such racks 2 attractive for use in IT data centers, where a multiplicity of racks may typically be found.

As seen from FIG. 1, the cable connection system 100 according to an embodiment of the present invention comprises at least a base 1. The base 1 is configured to be coupled to any given cable that is to be connected to the given rack 2. Such a given cable may comprise a cable for connection of the given rack 2 to resources such as, for example, power, network, storage and so forth. The given cable may comprise copper or electrically conductive fiber, for example.

Also provided is a coupling mechanism 3, 4 that is configured to couple the base 1 to the given rack 2 in a given connect mode of operation of the cable connection system 100 according to an embodiment of the present invention. The coupling mechanism 3, 4 comprises at least a group of base connectors 3 that are provided on at least a surface 1a of the base 1 that is arranged to lie substantially flush with the given rack 2. The coupling mechanism 3, 4 also comprises at least a group of rack connectors 4 provided for the given rack 2 on a surface 2a of the given rack 2. The surface 2a of the given rack 2 is arranged to lie substantially flush with the surface 1a of the base 1 on which the base connectors 3 are provided. The rack connectors 4 substantially correspond with, and are configured to be coupled to, the base connectors 3, in the given connect mode of operation. The given rack 2 may be fitted with fixed rack connectors 4 or, alternatively, the given rack 2 may be retrofitted with detachable rack connectors 4, the latter configuration providing an advantage of compatibility of an embodiment of the present invention with conventional racks 2 in IT data centers. The group of base connectors 3 and/or the group of rack connectors 4 may be configured to be substantially detachably coupled to each other; which is generally illustrated by arrow 5 in FIG. 1 in which the base connectors 3 and the rack connectors 4 are shown to be detachably coupled to each other in a substantially lateral plane.

The base connectors 3 provided on the surface 1a of the base 1 facilitate substantial coupling of the base 1 with the given rack 2. A further feature of the base 1 is that the base 1 may be designed in order to support such a substantial coupling function. For example, shape and/or dimensions of the base 1 may be chosen in accordance with a spatial configuration of the given rack 2 and/or taking into account spatial constraints due to a multiplicity of racks on a given floor space.

As can be seen from FIG. 1, and in one embodiment, the base 1 is provided in a substantially U-shape. Such a shape of the base 1 is substantially compatible with a shape of a base of the given rack 2 so that the base 1 can be coupled and/or slotted with respect to the given rack 2 with relative ease. In order to facilitate ease of understanding, the base 1 shown in FIG. 1 is shown with a given number and equal distribution of base connectors 3 on a surface 1a thereof. However, an embodiment of the present invention is not limited to such a scenario, and at least one base connector of a number and/or distribution of the base connectors 3 may be chosen to facilitate a desired coupling between the base 1 and the given rack 2, while taking other aspects into consideration, such as, for example, the shape of the base of the given rack 2, and constraints that may be placed on the design of the base 1. Such constraints, for example, may include limiting the number of base connectors 3 provided on the base 1 and/or distributing the base connectors 3 on the base 1 to correspond with rack connectors 4 provided in a limited number and/or an irregular distribution on the rack 2.

The base connectors 3 may be provided as fixed from the outset or detachably with respect to the base 1. The base 1 may be provided as a substantially detachable unit that may be coupled to another equipment unit, at the base of other equipment unit, in one embodiment, which is in a vicinity of the given rack 2. In this way, cable connection for any given rack 2 may be established without a need to create space for the base 1 and/or rearrangement of existing equipment in the vicinity of the rack 2. Such features may serve to enhance the versatility, flexibility and/or ease of use of an embodiment of the present invention.

Figure 2A:
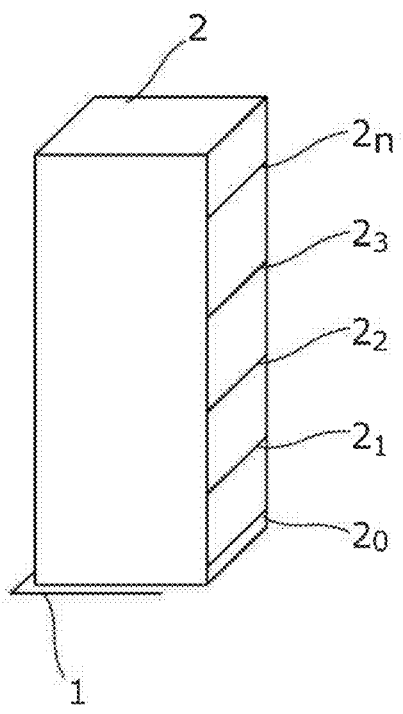
FIGS. 2a and 2b respectively illustrate a three-dimensional view of a connected mode and a disconnected mode of operation of a cable connection system, in accordance with embodiments of the present invention.
Figure 2B:
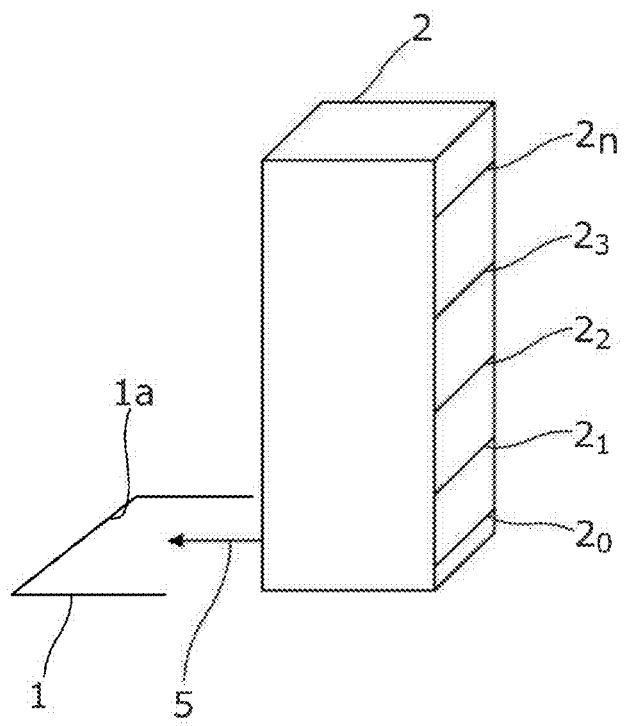

FIGS. 2a and 2b respectively illustrate a three-dimensional view of a connected mode and a disconnected mode of operation of a cable connection system 100, in accordance with embodiments of the present invention. As can be seen from FIGS. 2a and 2b, the base 1 and the given rack 2 are arranged such that respective surfaces 1a and 2a are arranged to lie substantially flush relative to each other. Viewing FIG. 2a in combination with FIG. 1, in a connected mode of operation, the base 1 is moved substantially laterally with respect to the given rack 2 such that the base connectors 3 on the surface 1a of the base 1 are coupled with the rack connectors 4 on the surface 2a (see FIG. 1) of the given rack 2. In a disconnected mode of operation, the base 1 is laterally decoupled from the given rack 2 as denoted by arrow 5 shown in FIG. 2b. Because the base connectors 3 and the rack connectors 4 are detachably coupled to each other, the base connectors 3 and the rack connectors 4 may be uncoupled with relative ease and without the need to provide specific resources to decouple the base connectors 3 and the rack connectors 4. FIGS. 2a and 2b also schematically illustrate a configuration of racks 2 that may typically be found in IT data centers. Any given rack 2 has multiple slots $2_0, 2_1, 2_2, 2_3, \ldots 2_n$. Each slot provides a space for storing at least a given network server which is securely screwed into place within the slot $2_0, 2_1, 2_2, 2_3, \ldots 2_n$.

Figure 3A:
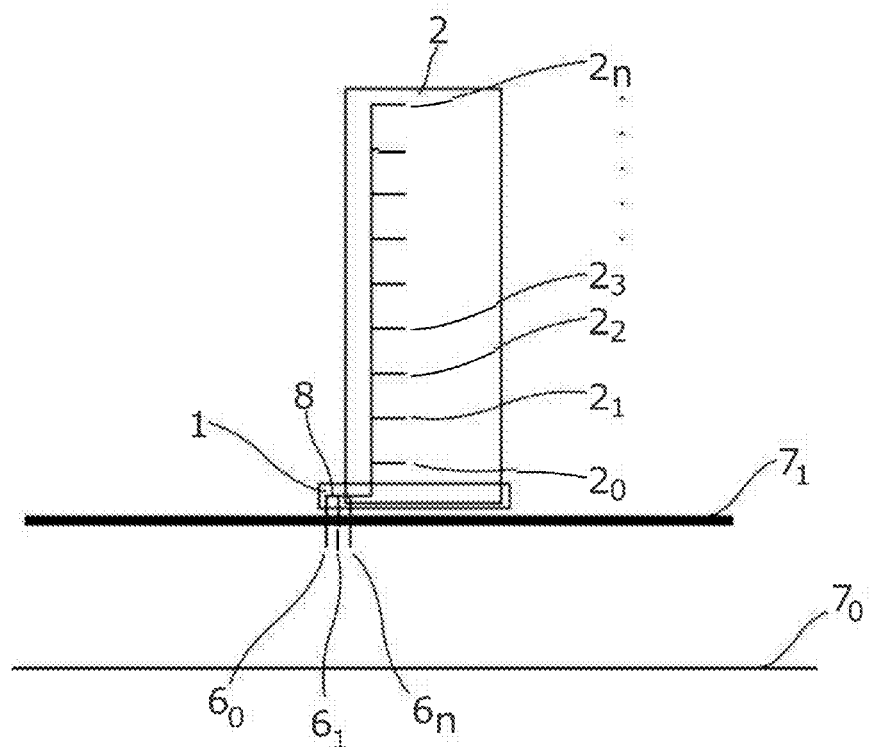
FIGS. 3a and 3b respectively correspond to FIGS. 2a and 2b and respectively illustrate side-view of a connected mode and a disconnected mode of operation of a cable connection system, in accordance with embodiments of the present invention.
Figure 3B:
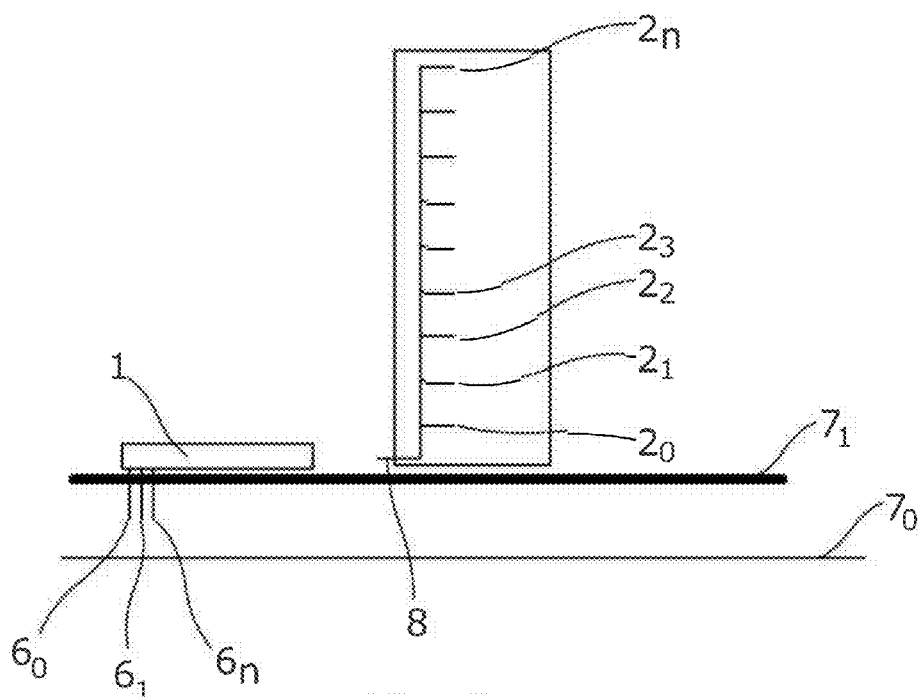

FIGS. 3a and 3b respectively correspond to FIGS. 2a and 2b and respectively illustrate a side-view of a connected mode and a disconnected mode of operation of a cable connection system 100, in accordance with embodiments of the present invention.

As can be seen from both FIGS. 3a and 3b, the base 1 is configured to be coupled to any given cable $6_0, 6_1, \ldots 6_n$ that is to be connected with the given rack 2 and that is most provided, in one embodiment, in a raised floor configuration $7_1$ above a floor surface $7_0$ on which at least the base 1 and/or the given rack 2 is provided. In a connect mode of operation shown in FIG. 3a, and as explained previously with reference to FIG. 1, base connectors 3 that are provided for base 1 are configured to be coupled to rack connectors 4 that are provided for the given rack 2. When the base 1 is coupled to the given rack 2, the given cables $6_0, 6_1, \ldots 6_n$ are coupled to at least a line connection 8. The line connection 8 is coupled to any given slot $2_0, 2_1, 2_2, 2_3, \ldots 2_n$ of the given rack 2. Thus, connection of any given cable $6_0, 6_1, \ldots 6_n$ to any given slot $2_0, 2_1, 2_2, 2_3, \ldots 2_n$ of given rack 2 may be facilitated. In an embodiment of the present invention, and as previously mentioned, the given cables $6_0, 6_1, \ldots 6_n$ that are to be coupled to any given slot $2_0, 2_1, 2_2, 2_3, \ldots 2_n$ in the given rack 2 need not be limited to electrical cabling and may also be storage or network cabling. In this regard, the given cables $6_0, 6_1, \ldots 6_n$ may comprise copper or electrically conductive fiber.

Figure 4:
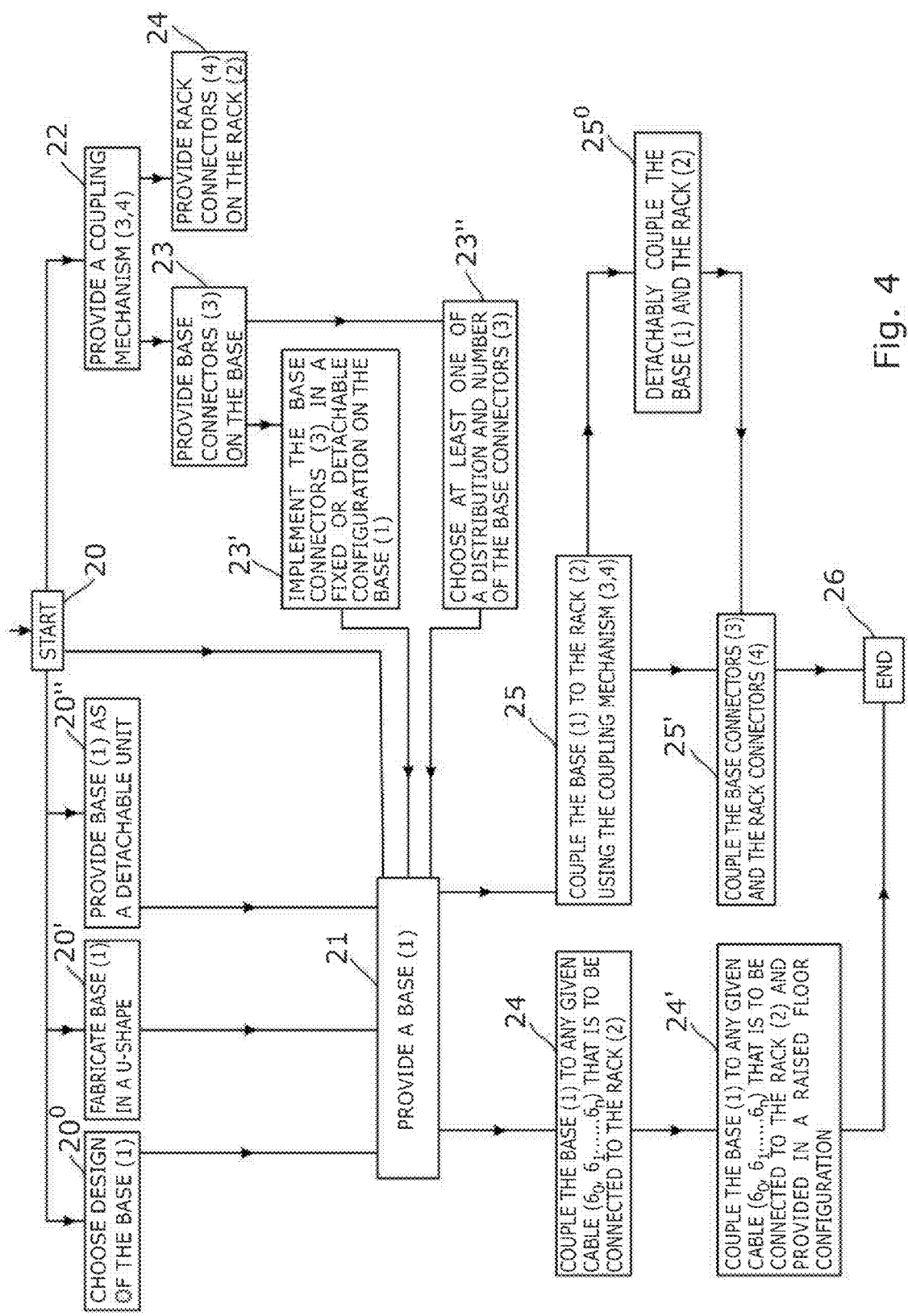
FIG. 4 is a flow chart of a method, in accordance with embodiments of the present invention.

FIG. 4 is a flow chart of a method, in accordance with embodiments of the present invention. The method of FIG. 4 facilitates cable connection to at least a given rack 2 comprising at least an electronic equipment unit provided in a stacked configuration.

The method of FIG. 4 starts at step 20 and proceeds to step 21 where at least a base 1 is provided. At step $20^0$, consideration may be given to at least a design of the base 1 to facilitate a substantial coupling of the base 1 with the given rack 2. A further consideration is what shape is to be provided for the base 1, which may be implemented at step 20' where, in one embodiment, the base 1 is fabricated in a substantially U-shape. A yet further consideration for the base 1 may be to provide the base 1 as a detachable unit which may be retrofitted onto an existing structure in a vicinity of the given rack 2, where a cable connection that may potentially be desired for connection to the given rack 2 is also accessible by the base 1, which is represented at step 20".

Also following step 20, at least a coupling mechanism 3, 4 is provided at step 22. In respect of the provision of the coupling mechanism 3, 4, at least a group of base connectors 3 are provided on at least a surface 1a of the base 1. The surface 1a is arranged to lie substantially flush with the given rack 2 at step 23. As shown at step 23', the base connectors 3 may be provided as substantially fixed or detachable with respect to the base 1. As shown at step 23", a distribution and/or a number of the base connectors 3 is provided so as to facilitate a desired coupling between the base 1 and the given rack 2.

At step 24 following step 21, the base 1 adapted with the base connectors 3 is configured to be coupled to any given cable $6_0, 6_1, \ldots 6_n$ that is to be connected with the given rack 2. In this respect, in a one embodiment of the present invention, at step 24', the base 1 is coupled to any given cable 6₀, 6₁, ... 6ₙ that is to be connected with the given rack 2 and that is substantially provided in a raised floor configuration 7₁ above a floor surface 7₀ on which the base 1 and/or the given rack 2 is provided.

At step 25 following step 21, the base 1 is configured to be connected with the given rack 2 using the coupling mechanism 3, 4. In this regard, and as shown at step 25⁰, the base 1 and/or the given rack 2 are configured to be substantially detachably coupled from each other. In one embodiment of the present invention, and at step 25', the base connectors 3 and the rack connectors 2 are coupled, and in this way, coupling between the base 1 and the given rack 2 is performed. Step 26 marks the end of any steps according to an embodiment of a method of the present invention.

Any one of steps 20⁰, 20' and 20" may precede step 21 in one embodiment, and are not performed in any given sequence. Steps 20⁰, 20' and 20" may be performed simultaneously in an embodiment of the present invention.

Steps 21 and 22 are performed after the start step 20, steps 23 and 24 are performed in relation to step 22, and steps 23' and 23" and steps 24 and 25 are not restricted to a given sequence of performance with respect to each other and may even be performed simultaneously.

The present invention has been described above purely by way of example and modifications of detail can be made within the scope of the present invention.

Each feature disclosed in the description may be provided independently or in any appropriate combination.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others or ordinary skill in the art to understand the embodiments disclosed herein.

What is claimed is:

1. A method of forming a cable connection system, said method comprising:
    providing a rack comprising a first rack surface, a second rack surface perpendicular to the first rack surface, and an array of slots into which corresponding network servers are screwed into place, wherein the first rack surface is perpendicular to a raised floor surface that is above a floor surface, wherein the second rack surface is on, and parallel to, the raised floor surface, and wherein the slots of the array of slots are sequenced in a first direction perpendicular to the raised floor surface and extend above the raised floor surface in the first direction;
    providing a base mechanically and electrically coupled to a plurality of cables, wherein the base comprises a first base surface and a second base surface perpendicular to the first base surface, wherein the first base surface is perpendicular to the raised floor surface, wherein the second base surface is on, and parallel to, the raised floor surface;
    providing a line connection mechanically and electrically connected to the rack, wherein the plurality of cables electrically connected to the base are electrically connected to the line connection, wherein the line connection is configured to electrically connect to any given slot of the array of slots, wherein the line connection is disposed between the raised floor surface and a first slot of the array of slots, and wherein the first slot is closer to the raised floor surface than is any other slot of the array of slots; and
    coupling the base with the rack, using a coupling mechanism, during a connect mode of operation, said coupling mechanism comprising at least three base connectors on the first surface of the base and a a respective at least three rack connectors on the first surface of the rack, wherein the at least three base connectors are mechanically and electrically connected to the respective at least three rack connectors during the connect mode of operation which facilitates connection, via the line connection, of any cable of the three cables to said any given slot of the array of slots.

2. The method of claim of 1, said method comprising:
    configuring the base and the rack to be substantially detachably coupled to each other.

3. The method of claim 1, said method comprising:
    configuring the base to facilitate a substantial coupling of the base with the rack.

4. The method of claim 1, said method comprising:
    fabricating the base in a substantially U-shape.

5. The method of claim 1, said method comprising:
    providing a distribution and/or a number of the base connectors to facilitate a specified coupling between the base and the rack.

6. The method of claim 1, said method comprising:
    providing the base as a substantially detachable unit.

7. The method of claim 1, said method comprising:
    providing the base connectors to be substantially detachable from the base.

8. The method of claim 1, wherein the first surface of the base is parallel to, and substantially flush with, the first surface of the rack.

9. The method of claim 1, wherein the rack connectors substantially correspond with, and are coupled to, the base connectors during the connect mode of operation.

10. The method of claim 1, wherein the rack extends above the base in the first direction.

11. The method of claim 1, wherein the at least three base connectors are uniformly distributed on the first surface of the base.

12. The method of claim 1, wherein the at least three base connectors are nonuniformly distributed on the first surface of the base.

13. The method of claim 1, wherein said providing the base comprises providing a shape of the base.

14. The method of claim 1, said method comprising:
    choosing a total number of base connectors for the at least three base connectors.

* * * * *